United States Patent
Iwamoto (10) Patent No.: US 9,326,603 B2
(45) Date of Patent: May 3, 2016

(54) SLIDE RAIL AND EQUIPMENT MOUNTING RACK

(71) Applicant: NEC Corporation, Minato-ku, Tokyo (JP)

(72) Inventor: Misa Iwamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/628,761

(22) Filed: Feb. 23, 2015

(65) Prior Publication Data

US 2015/0245709 A1    Sep. 3, 2015

(30) Foreign Application Priority Data

Feb. 28, 2014  (JP) ................. 2014-038398

(51) Int. Cl.
*A47B 88/16*   (2006.01)
*H05K 7/14*    (2006.01)
*A47B 88/04*   (2006.01)

(52) U.S. Cl.
CPC ............. *A47B 88/16* (2013.01); *A47B 88/04* (2013.01); *H05K 7/1489* (2013.01)

(58) Field of Classification Search
CPC ...... A47B 57/585; A47B 88/16; A47B 88/04; A47B 45/00; A47B 57/00; A47B 2210/0018; A47B 2210/0016; H05K 7/1489
USPC ................. 312/334.44–334.47, 333
See application file for complete search history.

(56) References Cited

U.S. PATENT DOCUMENTS

| | | | | |
|---|---|---|---|---|
| 4,993,847 A | * | 2/1991 | Hobbs | A47B 88/16 312/334.46 |
| 4,998,828 A | * | 3/1991 | Hobbs | A47B 88/10 312/334.46 |
| 5,085,523 A | * | 2/1992 | Hobbs | A47B 88/16 384/18 |
| 5,795,044 A | * | 8/1998 | Trewhella, Jr. | A47B 88/16 292/87 |
| 6,238,031 B1 | * | 5/2001 | Weng | A47B 88/0407 312/333 |
| 6,386,660 B1 | * | 5/2002 | Yang | A47B 88/044 312/334.44 |
| 6,601,933 B1 | * | 8/2003 | Greenwald | A47B 88/08 312/330.1 |
| 6,764,149 B2 | * | 7/2004 | Jurja | A47B 88/16 312/333 |
| 6,796,625 B2 | * | 9/2004 | Lauchner | H05K 5/0013 312/333 |
| 6,942,307 B1 | * | 9/2005 | Lammens | A47B 88/16 312/334.1 |

(Continued)

FOREIGN PATENT DOCUMENTS

| | | |
|---|---|---|
| JP | S55-56140 U | 4/1980 |
| JP | S60-58041 U | 4/1985 |

(Continued)

OTHER PUBLICATIONS

Extended European Search Report of EP Application No. 14199916.9 dated Jul. 16, 2015.

(Continued)

*Primary Examiner* — Daniel J Troy
*Assistant Examiner* — Hiwot Tefera (57) ABSTRACT

A slide rail includes: a rail assembly 2; an inner rail 4 mounted on the rail assembly 2, and slidable in a longitudinal direction of the rail assembly 2; and a locking arm 5 a rear end portion of which is secured to a surface of the inner rail 4 facing the rail assembly 2, and a front end portion of which is a free end, wherein the locking arm 5 has a lock protrusion portion 5*a* that, when pulling out the inner rail 4 from the rail assembly 2, locks slide at a predetermined position, and wherein the rail assembly 2 has a lock hole 2*a* for catching the lock protrusion portion 5*a*.

5 Claims, 7 Drawing Sheets

(56) References Cited

U.S. PATENT DOCUMENTS

| | | | | |
|---|---|---|---|---|
| 7,008,030 B2 * | 3/2006 | Yang | ............... | A47B 88/04 312/334.44 |
| 7,661,778 B2 * | 2/2010 | Yang | ............... | H05K 7/1489 312/333 |
| 7,731,312 B2 * | 6/2010 | Chen | ............... | A47B 88/16 312/333 |
| 8,511,765 B1 * | 8/2013 | Chen | ............... | A47B 67/04 312/286 |
| 8,690,271 B1 * | 4/2014 | Chang | ............... | A47B 88/0422 248/298.1 |
| 2005/0218762 A1 * | 10/2005 | Lammens | ............... | A47B 88/16 312/334.46 |
| 2007/0279886 A1 * | 12/2007 | Grady | ............... | G06F 1/187 361/809 |
| 2008/0122333 A1 * | 5/2008 | Tseng | ............... | A47B 88/10 312/333 |
| 2008/0246378 A1 * | 10/2008 | Chen | ............... | A47B 88/16 312/334.46 |
| 2010/0033926 A1 | 2/2010 | Du et al. | | |
| 2012/0163740 A1 | 6/2012 | Yu et al. | | |
| 2012/0170877 A1 | 7/2012 | Yu et al. | | |
| 2013/0016461 A1 | 1/2013 | Fan et al. | | |
| 2013/0016929 A1 | 1/2013 | Fan et al. | | |
| 2013/0016930 A1 * | 1/2013 | Fan | ............... | H05K 7/1489 384/35 |

FOREIGN PATENT DOCUMENTS

| | | |
|---|---|---|
| JP | H2-134044 U | 11/1990 |
| JP | 2003-325256 A | 11/2003 |
| JP | 2005-143536 A | 6/2005 |
| JP | 2005-180725 A | 7/2005 |
| JP | 2005-315504 A | 11/2005 |
| JP | 2011-159716 A | 8/2011 |

OTHER PUBLICATIONS

Japanese Office Action for Jp Application No. 2014-038398 mailed on Mar. 1, 2016 with English Translation.

* cited by examiner

SLIDE RAIL AND EQUIPMENT MOUNTING RACK

This application is based upon and claims the benefit of priority from Japanese patent application No. 2014-038398, filed on Feb. 28, 2014, the disclosure of which is incorporated here in its entirety by reference.

TECHNICAL FIELD

The present invention relates to an equipment mounting rack for mounting equipment and a slide rail.

BACKGROUND ART

Figure 4:
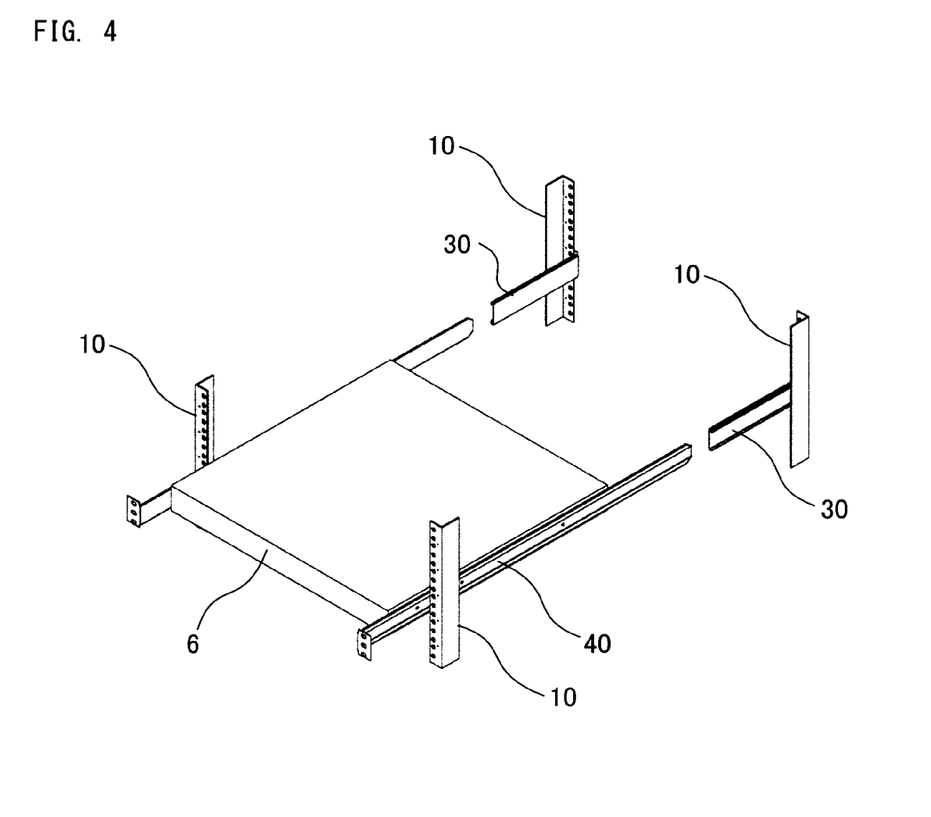
FIG. 4 It is an explanatory view depicting a state in which equipment is mounted on a rack.

FIG. 4 is an explanatory view depicting a state in which equipment is mounted on a rack. In the case where wide equipment such as an apparatus 6 depicted in FIG. 4 is mounted on a rack (e.g. a 19-inch rack), there is little space on the sides of the apparatus 6. Besides, in the case where other equipment is mounted on the rack, there is little space above and below the apparatus 6. Accordingly, the following method is used in an operation of mounting such equipment on the rack. Short rear brackets 30 are fixed, by screws, to two rear rack posts 10 of four rack posts 10 provided in the front and back and on both sides of the rack, as depicted in FIG. 4. Rear portions of inner rails 40 attached to the equipment (apparatus 6) are then inserted into the rear brackets 30.

With this method, however, when the worker inserts the rear portions of the inner rails 40 into the rear brackets 30, he or she cannot see the rear brackets 30 from in front of the apparatus 6. Two persons need to work in front of and behind the rack, in order to mount the apparatus 6 on the rack. Moreover, when the worker pulls out the apparatus 6 from the rack, he or she has difficulty in recognizing the timing at which the inner rails 40 disengage from the rear brackets 30. The worker may drop the apparatus 6 unless supported by another worker from under the apparatus 6.

Another method of mounting the equipment on the rack is a method that uses slide rails including inner rails and rail assemblies. The rail assemblies are fixed to the front rack posts, and fastened to the rear brackets fixed to the rear rack posts. The worker inserts the rear portions of the inner rails attached to the equipment, into the rail assemblies. The inner rails are slidable in the longitudinal direction of the rail assemblies. This method does not need an operation of inserting the rear portions of the inner rails attached to the equipment into the rear brackets.

Figure 5A:
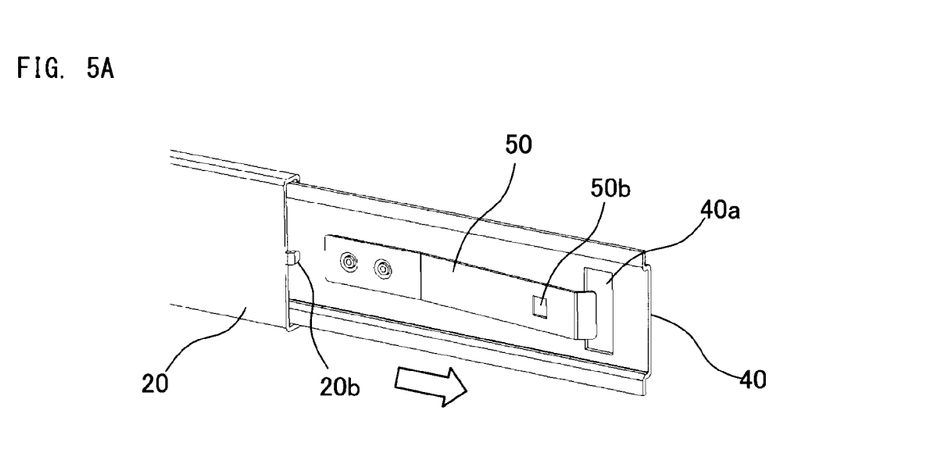
FIG. 5A It is a perspective view depicting a lock portion of a slide rail.

The slide rails each have a mechanism (hereafter referred to as "lock portion") of locking halfway through pulling out the inner rail from the rail assembly (for example, see Patent Literature (PTL) 1). A lock portion shaped as depicted in FIGS. 5A to 5E is described in PTL 1. FIGS. 5A to 5E are explanatory views depicting an example of the lock portion of the slide rail. FIG. 5A is a perspective view of the lock portion. FIGS. 5B to 5E are sectional views of the lock portion, depicting the longitudinal section of the lock portion depicted in FIG. 5A.

Figure 5B:
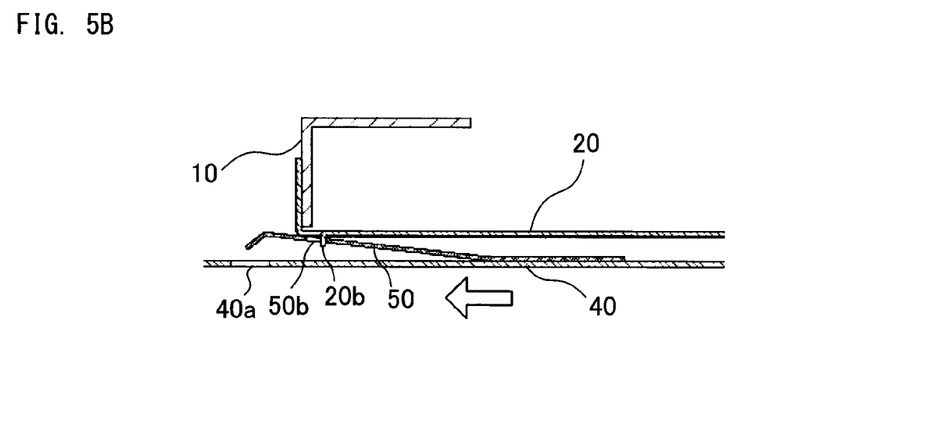
FIG. 5B It is a sectional view depicting the state of the lock portion of the slide rail during slide lock.
Figure 5C:
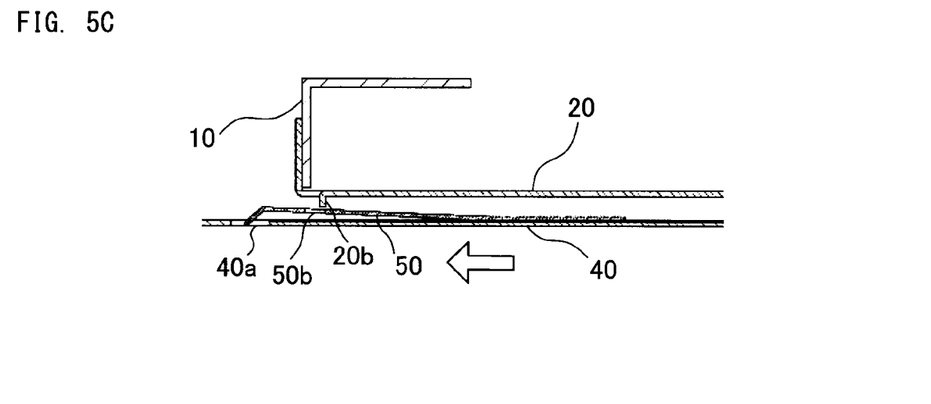
FIG. 5C It is a sectional view depicting the state of the lock portion of the slide rail during slide lock release.
Figure 5D:
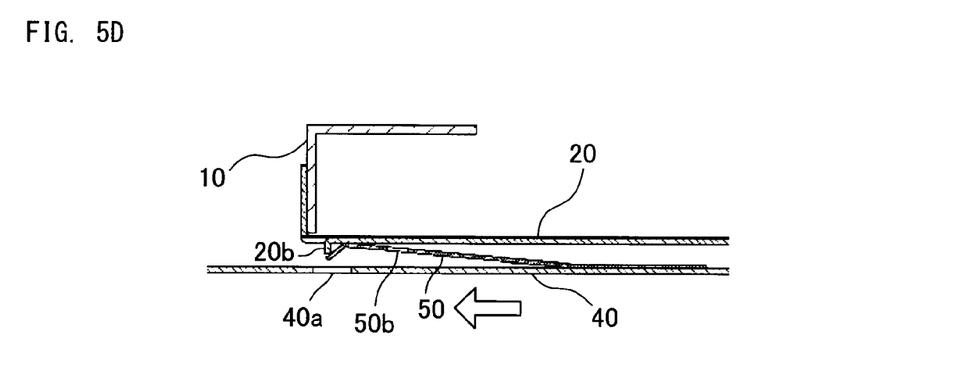
FIG. 5D It is a sectional view depicting the state of the lock portion of the slide rail when pulling out an inner rail 40.
Figure 5E:
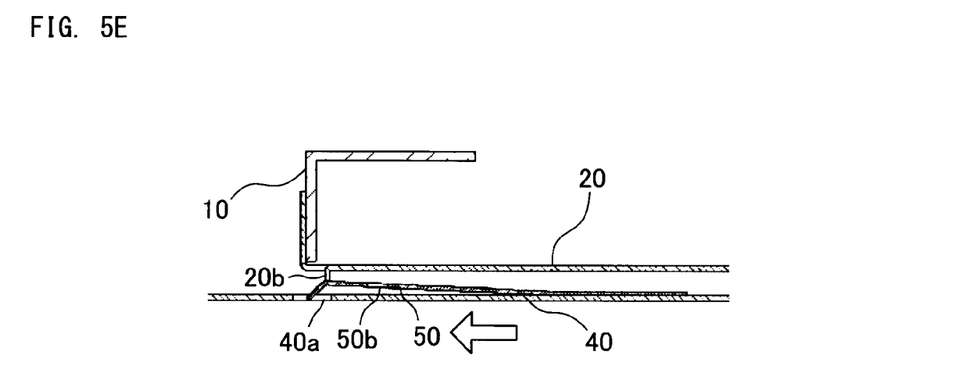
FIG. 5E It is a sectional view depicting the state of the lock portion of the slide rail when further pulling out the inner rail 40 from the state depicted in FIG. 5D.

FIG. 5B depicts the state of the lock portion during slide lock. FIG. 5C depicts the state of the lock portion during slide lock release. FIG. 5D depicts the state of the lock portion when pulling out the inner rail 40. FIG. 5E depicts the state of the lock portion when further pulling out the inner rail 40 from the state depicted in FIG. 5D. The hollow arrow in each of FIGS. 5A to 5E indicates the direction in which the inner rail 40 is pulled out.

In the lock portion described in PTL 1, a bent portion (lock protrusion portion 20b) provided on a rail assembly 20 enters a lock hole 50b formed in an intermediate part of a locking arm 50 fixed to the inner rail 40, thus stopping the slide halfway through pulling out the inner rail 40, as depicted in FIGS. 5A to 5C. The provision of such a mechanism in the slide rail enables a safe equipment mounting operation. The "bent portion" mentioned here indicates the part from the bent and turned section to the tip.

CITATION LIST

Patent Literature(s)

PTL 1: Japanese Patent Application Laid-Open No. 2011-159716

SUMMARY

An exemplary object of the present invention is to provide a slide rail and an equipment mounting rack that enable safer mounting of equipment on a rack and minimize the rail thickness.

A slide rail according to the present invention includes: a rail assembly; an inner rail accommodated in the rail assembly, and slidable in a longitudinal direction of the rail assembly; and a locking arm a rear end portion of which is secured to a surface of the inner rail facing the rail assembly, and a front end portion of which is a free end, wherein the locking arm has a lock protrusion portion that, when pulling out the inner rail from the rail assembly, locks slide at a predetermined position, and wherein the rail assembly has a lock hole for catching the lock protrusion portion.

An equipment mounting rack according to the present invention includes a slide rail attached to both sides of a rack body, in a front-back direction, wherein the slide rail includes: a rail assembly; an inner rail accommodated in the rail assembly, and slidable in a longitudinal direction of the rail assembly; and a locking arm a rear end portion of which is secured to a surface of the inner rail facing the rail assembly, and a front end portion of which is a free end, wherein the locking arm has a lock protrusion portion that, when pulling out the inner rail from the rail assembly, locks slide at a predetermined position, and wherein the rail assembly has a lock hole for catching the lock protrusion portion.

DESCRIPTION OF EXEMPLARY EMBODIMENT

Exemplary Embodiment 1

The following describes Exemplary Embodiment 1 of the present invention with reference to drawings.

Figure 1A:
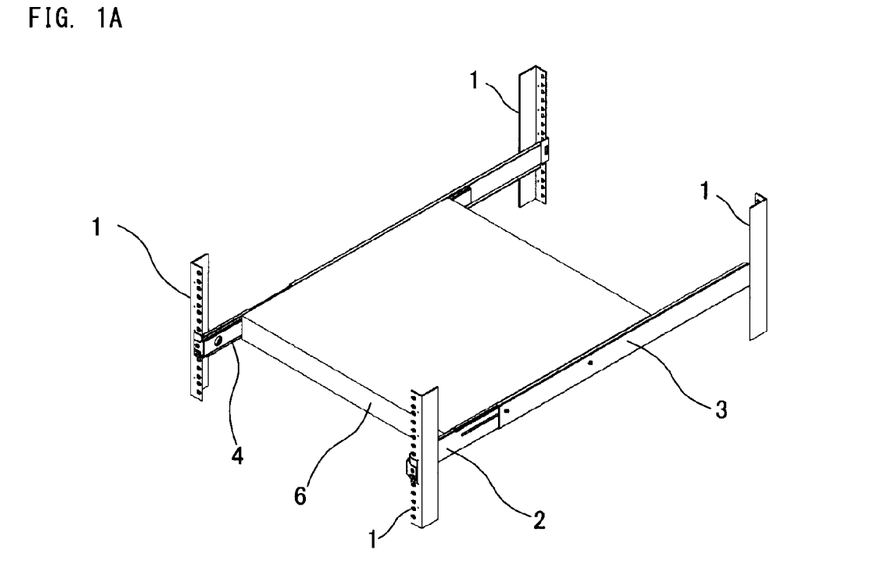
FIG. 1A It is an explanatory view depicting a state in which an apparatus 6 is mounted on an equipment mounting rack including a slide rail according to the present invention.
Figure 1B:
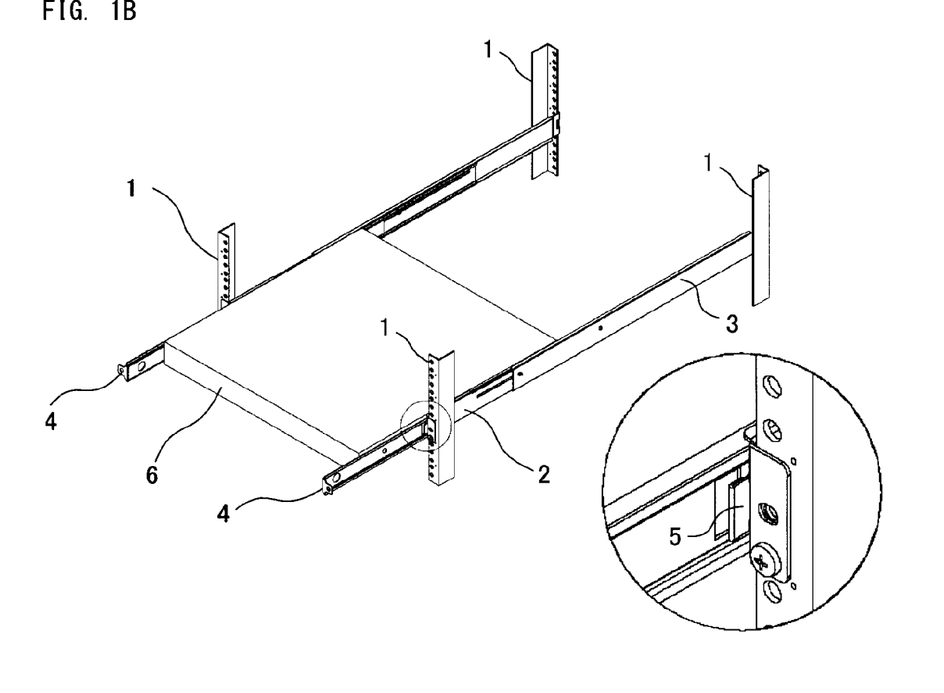
FIG. 1B It is an explanatory view depicting a state in which the slide rail is locked halfway through pulling out the apparatus 6 mounted on the equipment mounting rack including the slide rail according to the present invention.

FIGS. 1A and 1B are explanatory views depicting an example of an equipment mounting rack (hereafter simply referred to as "rack") including a slide rail according to the present invention. FIG. 1A depicts a state in which an apparatus 6 is mounted on the rack. FIG. 1B depicts a state in which the slide rail is locked halfway through pulling out the apparatus 6 mounted on the rack.

The slide rail according to the present invention includes a rail assembly 2, an inner rail 4, and a locking arm 5.

The rail assembly 2 is fixed to each rack post 1 equipped in the rack.

The inner rail 4 is mounted on the rail assembly 2, and is slidable in the longitudinal direction of the rail assembly 2.

The locking arm 5 is secured to the surface of the inner rail 4 facing the rail assembly 2, and locks the sliding movement of the inner rail 4.

Figure 2A:
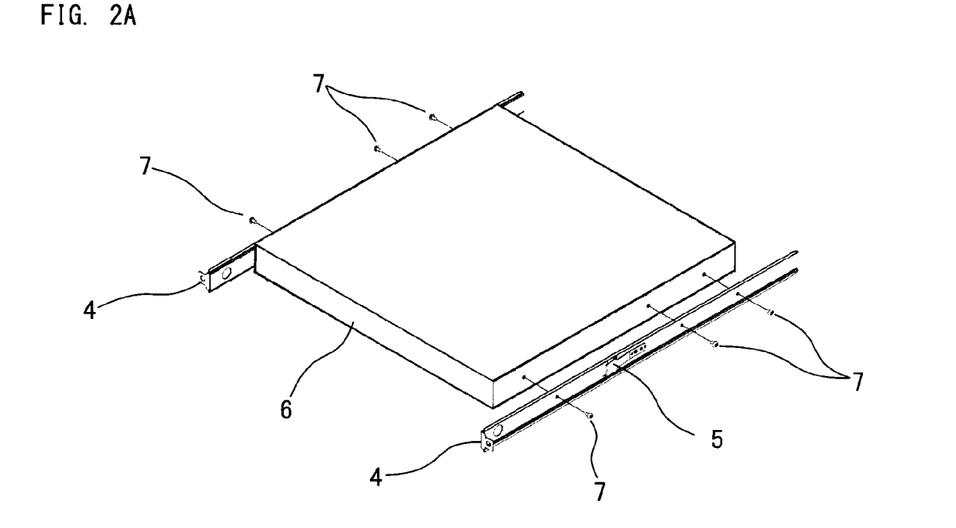
FIG. 2A It is an explanatory view depicting a state in which the equipment is mounted on the rack by the slide rail according to the present invention.
Figure 2B:
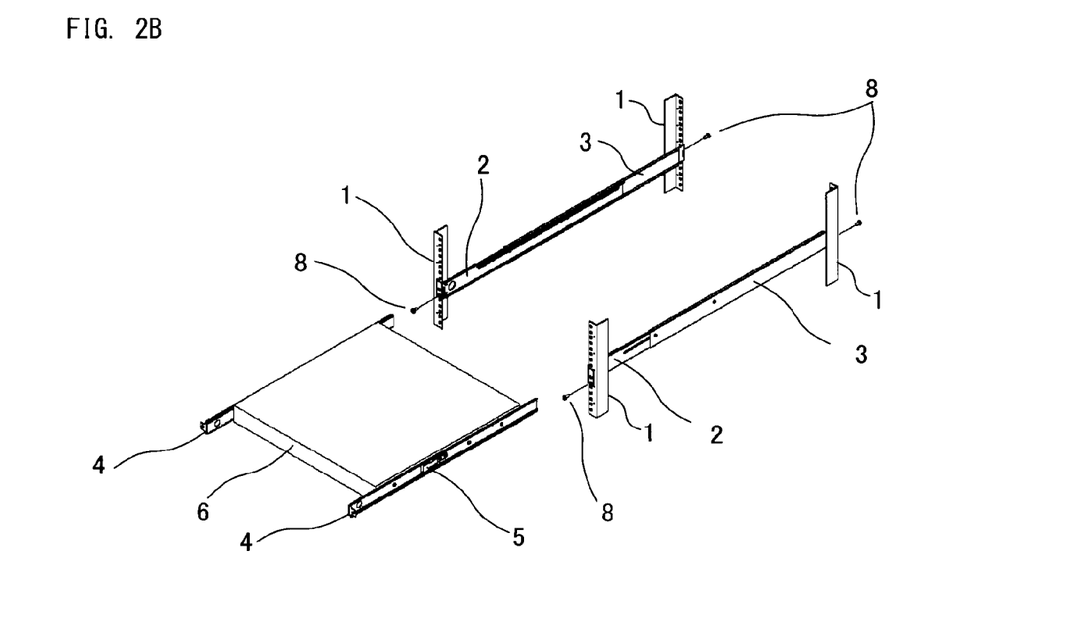
FIG. 2B It is an explanatory view depicting a state in which the equipment is mounted on the rack by the slide rail according to the present invention.

FIGS. 2A and 2B are explanatory views depicting a state in which the equipment (apparatus 6) is mounted on the rack by the slide rail according to the present invention.

As depicted in FIG. 2A, the worker attaches the inner rails 4 to which the locking arms 5 are secured, to both side surfaces of the apparatus 6 horizontally and symmetrically by apparatus attachment screws 7.

Next, as depicted in FIG. 2B, the worker fastens the rail assemblies 2 and rear brackets 3 together, according to the depth of the rack, i.e. according to the front-back interval of the four rack posts 1 provided in the front and back and on both sides of the rack. Here, the worker fastens the rail assemblies 2 and the rear brackets 3 with rivets or screws to enable expansion/contraction in the front-back direction.

Next, the worker fixes the fastened rail assemblies 2 and rear brackets 3 to the rack posts 1, using rail attachment screws 8.

Lastly, the worker inserts the inner rails 4 attached to the apparatus 6 into the rail assemblies 2 fixed to the rack posts 1, and fixes them using screws.

Figure 3A:
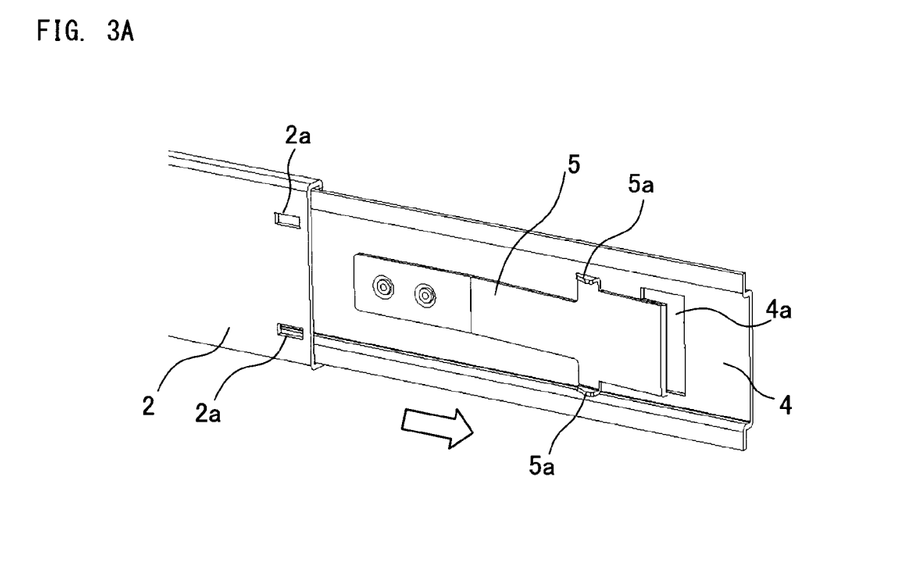
FIG. 3A It is a perspective view depicting a lock portion of the slide rail according to the present invention.
Figure 3B:
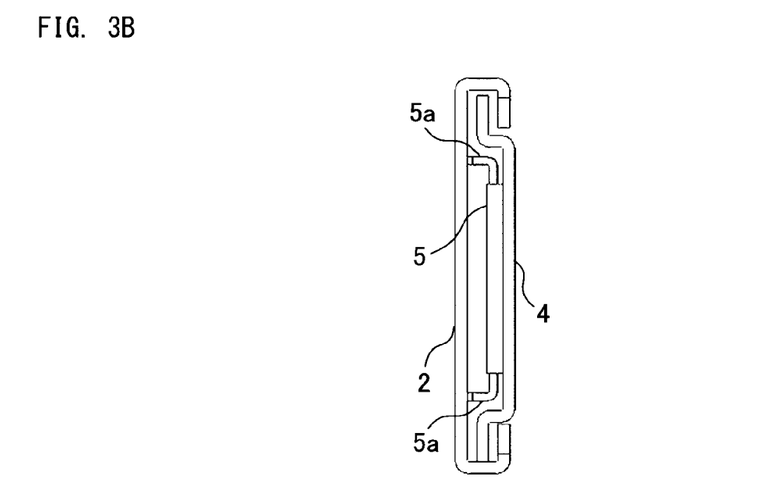
FIG. 3B It is a sectional view depicting the lock portion of the slide rail according to the present invention.
Figure 3C:
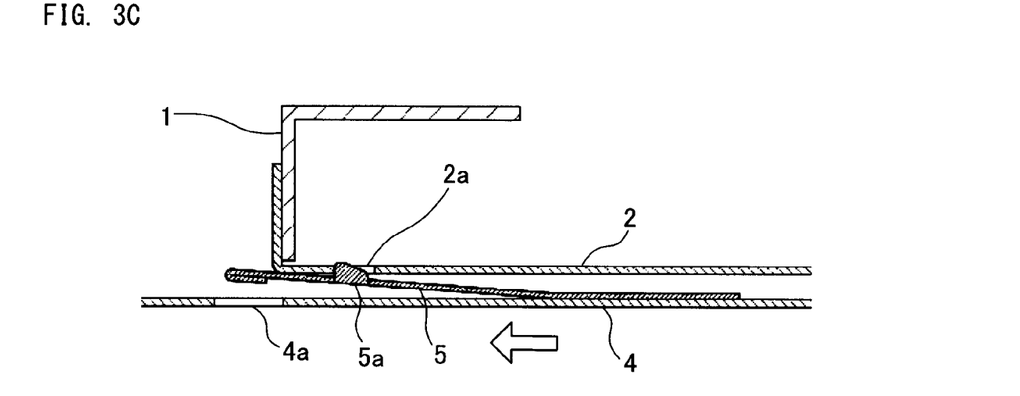
FIG. 3C It is a sectional view depicting the state of the lock portion of the slide rail during slide lock according to the present invention.
Figure 3D:
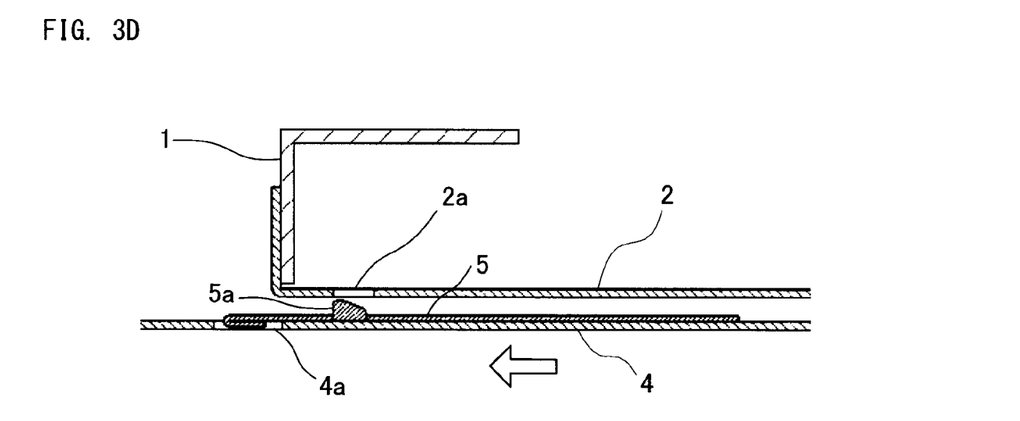
FIG. 3D It is a sectional view depicting the state of the lock portion of the slide rail during slide lock release according to the present invention.

FIGS. 3A to 3D are explanatory views depicting the structure of a lock portion of the slide rail according to the present invention. FIG. 3A is a perspective view of the lock portion. FIGS. 3B, 3C, and 3D are sectional views of the lock portion.

FIG. 3B depicts the cross section of the lock portion depicted in FIG. 3A. FIGS. 3C and 3D depict the longitudinal section of the lock portion depicted in FIG. 3A.

FIG. 3C depicts the state of the lock portion during slide lock. FIG. 3D depicts the state of the lock portion during slide lock release. The hollow arrow in each of FIGS. 3A, 3C, and 3D indicates the direction in which the inner rail 4 is pulled out.

A mechanism of locking the inner rail 4 when pulling out the inner rail 4 from the rail assembly 2 of the slide rail is described below, with reference to FIGS. 3A to 3D. Hereafter, the side to which the inner rail is pulled out from the slide rail is referred to as "front end side", and the side opposite to the front end side as "rear end side".

As depicted in FIG. 3B, the cross section of the rail assembly 2 is C-shaped. The inner rail 4 has a shape that meshes with the rail assembly 2 on the upper and lower sides (the upper and lower sides in FIG. 3B). Thus, the inner rail 4 is accommodated in the rail assembly 2, and is slidable inside the rail assembly 2 in the longitudinal direction.

The locking arm 5 (in detail, the rear end portion of the locking arm 5) is secured to the surface of the inner rail 4 facing the rail assembly 2. The front end portion of the locking arm 5 is a free end and is swingable. The locking arm 5 is provided with a bent portion (a lock protrusion portion 5a) on the upper and lower sides (the upper and lower sides in FIGS. 3A and 3B), at a predetermined position between the front end portion and the rear end portion.

As depicted in FIG. 3C, the free end (front end portion) of the locking arm 5 is provided with a bent portion formed by hemming at the position pressed by the worker's hand when releasing the lock, to keep the hand from touching the edge. The inner rail 4 has a lock clearance hole 4a for letting the bent portion escape, at the position facing the bent portion.

The rail assembly 2 has a lock hole 2a at the position facing the lock protrusion portion 5a. As depicted in FIG. 3C, when the inner rail 4 is pulled out to a predetermined position, the lock protrusion portion 5a enters the lock hole 2a. This stops the slide of the inner rail 4.

As depicted in FIG. 3D, the slide lock is released when the worker presses the free end of the locking arm 5. Here, the locking arm 5 is substantially horizontal in the longitudinal direction.

In this exemplary embodiment, no protrusion is provided on the surface of the rail assembly 2 facing the inner rail 4. Accordingly, when sliding the inner rail 4, there is no obstruction to the sliding movement other than the thickness of the lock protrusion portion 5a. Since the space between the inner rail 4 and the rail assembly 2 only needs to have the thickness of the lock protrusion portion 5a, the space between the inner rail 4 and the rail assembly 2 can be minimized. Thus, the use of the lock portion depicted in FIGS. 3A to 3D in the slide rail allows a thin slide rail to be produced.

As described above, in this exemplary embodiment, a slide rail includes: a rail assembly 2; an inner rail 4 accommodated in the rail assembly 2, and slidable in a longitudinal direction of the rail assembly 2; and a locking arm 5 a rear end portion of which is secured to a surface of the inner rail 4 facing the rail assembly 2, and a front end portion of which is a free end. The locking arm 5 has a lock protrusion portion 5a that, when pulling out the inner rail 4 from the rail assembly 2, locks slide at a predetermined position. The rail assembly 2 has a lock hole 2a for catching the lock protrusion portion 5a.

With such a structure, when wide equipment is mounted on the rack, the equipment can be put in and taken out by one person from the front even in the case where there is little space above and below the equipment. Moreover, when pulling out the equipment, the slide is locked at the predetermined position. This prevents the equipment from dropping and enables safe operation.

Furthermore, with such a structure, the thickness of the slide rail can be minimized. If a lock protrusion portion is provided on the surface of the rail assembly facing the inner rail, a diagonal bent portion greater than or equal to the height of the lock protrusion portion needs to be provided on the free end of the locking arm 5 in order to avoid interference between the lock protrusion portion and the inner rail, as mentioned earlier. The provision of the lock protrusion portion 5a on the locking arm 5, however, eliminates the need to provide the above-mentioned bent portion on the free end of the locking arm 5. The space between the rail assembly 2 and the inner rail 4 can therefore be minimized.

Thus, according to this exemplary embodiment, wide equipment can be safely mounted on the rack by the method using the slide rail, with it being possible to improve the maintainability of the equipment and the like. In addition, the thickness of the slide rail can be minimized.

Moreover, in this exemplary embodiment, the rail assembly 2 has no protrusion on a surface facing the inner rail 4. With such a structure, when sliding the inner rail 4, there is no obstruction to the sliding movement other than the thickness of the lock protrusion portion 5a. This contributes to a smaller space between the inner rail 4 and the rail assembly 2. A thin slide rail can be produced in this way.

Moreover, in this exemplary embodiment, the lock protrusion portion 5a is formed by two upper and lower bent portions arranged in a transverse direction, at a predetermined position between the front end portion and the rear end portion of the locking arm 5. Safer slide lock can be realized by installing, on both sides of the rack, the slide rail having two upper and lower lock parts. This is because, even when the equipment is pulled out from the rack in a tilted state, any of the upper and lower lock protrusion portions 5a of the locking arm 5 is caught in the lock hole 2a of the rail assembly 2.

Moreover, in this exemplary embodiment, the lock of the slide of the inner rail 4 is released when the front end portion of the locking arm 5 is pressed toward the inner rail 4 and the lock protrusion portion 5a of the locking arm 5 disengages from the lock hole 2a of the rail assembly 2. With such a structure, the slide lock can be released reliably so long as the space between the inner rail 4 and the rail assembly 2 has the thickness of the lock protrusion portion 5a. In other words, the space between the inner rail 4 and the rail assembly 2 only needs to have the thickness of the lock protrusion portion 5a, so that the space between the inner rail 4 and the rail assembly 2 can be minimized.

Moreover, in this exemplary embodiment, the locking arm 5 has a bent portion formed by hemming, in the front end portion, and the inner rail 4 has, at a position facing the bent portion formed by hemming, a lock clearance hole 4a for letting the bent portion escape when releasing the lock of the slide. With such a structure, the worker's hand can be kept from touching the edge of the front end portion of the locking arm 5, enabling the worker to conduct the operation more safely. In addition, the height of the bent portion of the locking arm 5 can be minimized by forming such a bent portion that is folded 180 degrees by hemming, thus preventing an unnecessary increase of the thickness of the slide rail.

The foregoing exemplary embodiment may be partly or wholly described in the following supplementary notes, though the present invention is not limited to such.

(Supplementary note 1) An equipment mounting rack including a slide rail attached to both sides of a rack body, in a front-back direction, wherein the slide rail includes: a rail assembly; an inner rail accommodated in the rail assembly, and slidable in a longitudinal direction of the rail assembly; and a locking arm a rear end portion of which is secured to a surface of the inner rail facing the rail assembly, and a front end portion of which is a free end, wherein the locking arm has a lock protrusion portion that, when pulling out the inner rail from the rail assembly, locks slide at a predetermined position, and wherein the rail assembly has a lock hole for catching the lock protrusion portion.

With such a structure, wide equipment can be safely mounted on the rack body by the method using the slide rail, with it being possible to improve the maintainability of the equipment and the like. In addition, the space between the inner rail and the rail assembly can be reduced, thus minimizing the thickness of the slide rail.

(Supplementary note 2) The equipment mounting rack according to supplementary note 1, wherein the rail assembly has no protrusion on a surface facing the inner rail.

(Supplementary note 3) The equipment mounting rack according to supplementary note 1 or 2, wherein the lock protrusion portion is two upper and lower bent portions arranged in a transverse direction, at a predetermined position between the front end portion and the rear end portion of the locking arm.

(Supplementary note 4) The equipment mounting rack according to any one of supplementary notes 1 to 3, wherein the lock of the slide of the inner rail is released when the front end portion of the locking arm is pressed toward the inner rail and the lock protrusion portion of the locking arm disengages from the lock hole of the rail assembly.

(Supplementary note 5) The equipment mounting rack according to supplementary note 4, wherein the locking arm has a bent portion formed by hemming, in the front end portion, and wherein the inner rail has, at a position facing the bent portion formed by hemming, a lock clearance hole for letting the bent portion escape when releasing the lock of the slide.

In the lock portion depicted in FIGS. 5A to 5E, a diagonal bent portion greater than or equal to the height of the lock protrusion portion 20b needs to be provided on the free end of the locking arm 50 in order to prevent the free end of the locking arm 50 from colliding with the lock protrusion portion 20b provided on the rail assembly 20 and causing the inner rail 40 to be stuck, as depicted in FIG. 5D.

In the case where the bent portion is provided on the free end of the locking arm 50, the two bent portions (the lock protrusion portion 20b and the bent portion of the locking arm 50) overlap when sliding the inner rail 40, as depicted in FIG. 5E. Since the equipment is situated inside the inner rail 40 (the lower side in FIG. 5E), even when a clearance hole (a lock clearance hole 40a) for the bent portion of the locking arm 50 is formed in the inner rail 40, the locking arm 50 can only be let escape by the plate thickness of the inner rail 40. Hence, the space between the rail assembly 20 and the inner rail 40 needs to have the width of the two bent portions (the height in the vertical direction in FIG. 5E).

The slide rail thickness reduction is thus limited in the case where the lock portion depicted in FIGS. 5A to 5E is provided on the slide rail.

The present invention enables safer mounting of equipment on the rack and minimizes the thickness of the slide rail.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A slide rail comprising:
a rail assembly;
an inner rail accommodated in the rail assembly, and slidable in a longitudinal direction of the rail assembly; and
a locking arm a rear end portion of which is secured to a surface of the inner rail facing the rail assembly, and a front end portion of which is a free end,
wherein the locking arm has a lock protrusion portion that, when pulling out the inner rail from the rail assembly, locks slide at a predetermined position,
wherein the rail assembly has a lock hole for catching the lock protrusion portion,
wherein a lock of the slide of the inner rail is released when the front end portion of the locking arm is pressed toward the inner rail and the lock protrusion portion of the locking arm disengages from the lock hole of the rail assembly,
wherein the locking arm has a bent portion formed by hemming, in the front end portion, and
wherein the inner rail has, at a position facing the bent portion formed by hemming, a lock clearance hole for letting the bent portion escape when releasing the lock of the slide.

2. The slide rail according to claim 1, wherein the rail assembly has no protrusion on a surface facing the inner rail.

3. The slide rail according to claim 2, wherein the lock protrusion portion is two upper and lower bent portions arranged in a transverse direction, at a predetermined position between the front end portion and the rear end portion of the locking arm.

4. The slide rail according to claim 1, wherein the lock protrusion portion is two upper and lower bent portions arranged in a transverse direction, at a predetermined position between the front end portion and the rear end portion of the locking arm.

5. An equipment mounting rack comprising
a slide rail attached to both sides of a rack body, in a front-back direction,
wherein the slide rail includes:
a rail assembly;
an inner rail accommodated in the rail assembly, and slidable in a longitudinal direction of the rail assembly; and
a locking arm a rear end portion of which is secured to a surface of the inner rail facing the rail assembly, and a front end portion of which is a free end,
wherein the locking arm has a lock protrusion portion that, when pulling out the inner rail from the rail assembly, locks slide at a predetermined position,
wherein the rail assembly has a lock hole for catching the lock protrusion portion,
wherein a lock of the slide of the inner rail is released when the front end portion of the locking arm is pressed toward the inner rail and the lock protrusion portion of the locking arm disengages from the lock hole of the rail assembly,
wherein the locking arm has a bent portion formed by hemming, in the front end portion, and
wherein the inner rail has, at a position facing the bent portion formed by hemming, a lock clearance hole for letting the bent portion escape when releasing the lock of the slide.

\* \* \* \* \*